United States Patent [19]

Gunn

[11] 3,846,714

[45] Nov. 5, 1974

[54] MICROWAVE OSCILLATOR

[75] Inventor: John B. Gunn, Mt. Kisco, N.Y.

[73] Assignee: International Business Machines Corporation, Armonk, N.Y.

[22] Filed: Nov. 25, 1968

[21] Appl. No.: 778,861

Related U.S. Application Data

[63] Continuation of Ser. No. 524,406, Feb. 2, 1966, abandoned.

[52] U.S. Cl. .............. 331/107 G, 307/274, 307/286, 331/107 T, 332/52

[51] Int. Cl. .............................................. H03b 7/06

[58] Field of Search .................. 332/30 R, 52 31 T; 331/107 G, 107 T; 307/286, 287, 274

[56] References Cited

UNITED STATES PATENTS

| | | | |
|---|---|---|---|
| 3,134,949 | 5/1964 | Tiemann | 332/30 R |
| 3,365,583 | 1/1968 | Gunn | 331/107 G |
| 3,422,289 | 1/1969 | Atalla et al. | 331/107 G |
| 3,796,969 | 3/1974 | Bosch et al. | 331/107 G X |

*Primary Examiner*—Alfred L. Brody
*Attorney, Agent, or Firm*—John E. Dougherty, Jr.; Frank Chadurjian

[57] ABSTRACT

Microwave oscillator circuits are realized, which can be operated efficiently over a wide range of frequencies to produce high power outputs. The circuits are achieved by combining with a bulk effect semiconductor device a load circuit which provides circuit resonance at the desired output frequency, which need not be equal to or a harmonic of the transit mode frequency, and in which the impedance of the load circuit during oscillation is relatively large so that large amplitude oscillations are established across the semiconductor device and the load circuit. The large amplitude oscillations allow large power outputs to be realized. Illustratively, the frequency of the output is determined by the resonance characteristics of the load circuit, and may be less than, equal to or greater than the transit time frequency. One domain is nucleated and extinguished during each cycle of oscillation. Further, the voltage across the device is below the threshold voltage at a time a domain is extinguished and remains below threshold for an appreciable time so that a current waveform is produced which is conducive to high efficiency operation. Circuits of this type may also be operated with the supply voltage across the bulk effect device below the threshold voltage, in which case the circuit can be triggered to an oscillating state and the oscillating state extinguished by the application of control signals to the circuit.

13 Claims, 10 Drawing Figures

INVENTOR.
JOHN B. GUNN
BY John E. Dougherty Jr.
ATTORNEY

MICROWAVE OSCILLATOR

This application is a continuation of Ser. No. 524,406, filed Feb. 2, 1966, and now abandoned.

The present invention relates to microwave oscillator circuits and more particularly to improved microwave oscillator circuits which use bulk semiconductor devices in which domains of high electric field concentration are nucleated and propagated through the bulk semiconductor material.

The term "Gunn Effect" has been applied to the discovery that the application of an electric field in excess of a threshold field produces in certain semiconductor materials a moving region of very high electric field. This moving region was originally termed an electron shock wave but more recently the practice has been to describe the moving regions as a domain of high field concentration. A more detailed description of the Gunn Effect as well as of a number of devices using this effect is found in the following patent and published literature:

a. Application Ser. no. 374,758, filed by J. B. Gunn June 12, 1964, now Pat. No. 3,365,583 and assigned to the assignee of the subject application.

b. Application Ser. No. 473,015, filed by N. Braslau July 19, 1965 and assigned to the assignee of the subject application.

c. An article entitled "Instabilities in III–V Semiconductors" which appeared in the *IBM Journal of Research and Development*, Vol. 8, April 1964, p.141.

d. An article entitled "Continuous Microwave Oscillations of Current in GaAs" which appeared in the *IBM Journal of Research and Development*, Vol. 8, November 1964, p.545.

e. An article entitled "Instabilities of Current and of Potential Distribution in GaAs and InP" which appeared in the *Proceeding of the Symposium on Plasmas* published by Dunod, Paris, 1964, p.199.

Bulk effect devices using this phenomenon are formed simply of a wafer of semiconductor material and a pair of ohmic contacts connected to opposite faces of the wafer. The electric field is produced by connecting a voltage source across the electrodes and a domain is nucleated when this voltage exceeds the threshold voltage. This domain is nucleated in a first portion of the material and once nucleated propagates in the material to a second portion of the body where it is extinguished. A common form of the device includes two electrodes connected to opposite faces of a semiconductor wafer with one electrode termed the cathode connected to the negative terminal of a voltage supply and the other electrode termed the anode connected to the positive terminal of the voltage supply. In this type of device a domain is usually nucleated adjacent to the cathode and propagates across the semiconductor body to the anode where it is extinguished allowing another domain to be then nucleated at the cathode. This process repeats itself and since the transit time, that is the time required for a domain to nucleate and propagate through the material, is very short, in the order of a few nanoseconds, oscillations at microwave frequencies ($10^9$ cycles per sec.) are produced.

Prior art circuits of this type oscillate at a frequency determined by the transit time for a domain to propagate through the device and this mode of operation is termed transit time mode operation. The transit time also limits the output frequencies which can be realized in those circuits which through the use of resonant loads are operated at frequencies which are harmonics of the transit time frequency. Further this mode of operation produces a current waveform made up of a series of short pulses of high current separated by long periods of low current. This type of waveform places limitations on the efficiency with which the output microwave power can be generated. Though microwave oscillator circuits using bulk effect devices of this type have been successfully operated both on a pulsed and continuous basis to produce relatively high power outputs, limitations exist in the range of available output frequencies, the efficiency of the devices, and the total output power that can be obtained.

In accordance with the principles of the present invention microwave oscillator circuits are realized, which can be operated efficiently over a wide range of frequencies to produce high power outputs. these circuits are achieved by combining with the bulk effect semiconductor device a load circuit which provides circuit resonance at the desired output frequency, which need not be equal to or a harmonic of the transit mode frequency, and in which the impedance of the load circuit during oscillation is relatively large so that large amplitude oscillations are established across the semiconductor device and the load circuit. The large amplitude oscillations allow large power outputs to be realized. Further the supply voltage for the circuit, which from a steady state or DC standpoint equal to the average voltage across the semiconductor device, may be maintained essentially constant at a relatively low value, which, as is illustrated in the embodiments disclosed herein by way of example, can be only slightly greater than the threshold voltage or even less than the threshold voltage.

Though it would seem that the power output which can be realized for a given bulk effect device would increase with increasing supply voltage, this is not the case. One reason for this is based on the discovery that if the voltage across the device is increased above a certain maximum value, a different type of instability is established. This instability results from the fact that as the voltage is increased above this maximum value the current in the device rises, even when a previously nucleated domain is propagating, and the current rise with increasing voltage continues until a second threshold is reached at which a second domain is nucleated. The two domains exist together only for a short time and one, usually the first one, is extinguished. This type of double domain instability is produced whenever the voltage across the device, either the supply voltage itself or the supply voltage, plus the additive oscillating voltage exceeds this maximum voltage.

Though certain advantages may be realized by operating primarily in this high voltage range of double domain instability, which is here termed an over voltage mode, for high efficiency continuous wave operation, the single domain mode of operation is preferred. In this mode it is preferable though not necessary that the maximum voltage across the device is not allowed to go so high that instability of this second type occurs. There is thus a limit on the amplitude of oscillation across the device, the maximum allowable amplitude being equal to the difference between the supply voltage and the highest voltage which can be attained without initiating the double domain type of instability. The allowable amplitude of oscillations and, therefore, the amount of output microwave power that can be achieved without exceeding this limit increases as the supply voltage is decreased. Further even if this limitation is ignored, it has been believed that the minimum voltage across the device, either supply voltage alone or this voltage combined with the subtractive portion of the oscillating voltage, should be maintained above the threshold voltage, this is not the case. Advantages in efficiency, higher power output, and frequency range are achieved by operating in a mode here termed an under voltage mode, where the voltage across the device during oscillation falls below not only the threshold voltage but even below the sustaining voltage. This latter voltage is somewhat less than the threshold voltage and is the voltage necessary to maintain a domain propagating in the device once it is nucleated. When the voltage falls below this value, the domain is extinguished before it reaches the anode electrode. In certain of the embodiments of this under voltage mode disclosed here, the domain propagation is extinguished in this way, though in one embodiment the domain is allowed to reach the anode before the voltage falls below the sustaining voltage.

In the preferred practice of the invention, however, the frequency of the output is determined by the resonance characteristics of the load circuit, and may be less than, equal to or greater than the transit time frequency. One domain is nucleated and extinguished during each cycle of oscillation. Further the voltage across the device is below the threshold voltage at the time a domain is extinguished and remains below threshold for an appreciable time so that a current waveform is produced which is conducive to high efficiency operation. Circuits of this type may also be operated with the supply voltage across the bulk effect device below the threshold voltage, in which case the circuit can be triggered to an oscillating state and the oscillating state extinguished by the application of control signals to the circuit.

Therefore it is an object of the present invention to provide improved bulk effect microwave oscillator circuits.

It is a more specific object to provide circuits of this type in which high power outputs are realized at a predetermined frequency without significant noise.

It is a further object of this invention to provide bulk effect microwave oscillator circuits which can be operated to produce significant power outputs with relatively small supply voltages.

It is a further object to provide bulk effect microwave oscillator circuits which can be tuned to operate efficiently over a wide range of frequencies.

Another object of this invention is to provide a microwave oscillator circuit which can be triggered by control signals between oscillating and non-oscillating states.

The foregoing and other objects, features and advantages of the invention will be apparent from the following more particular description of preferred embodiments of the invention, as illustrated in the accompanying drawings.

Figure 1:
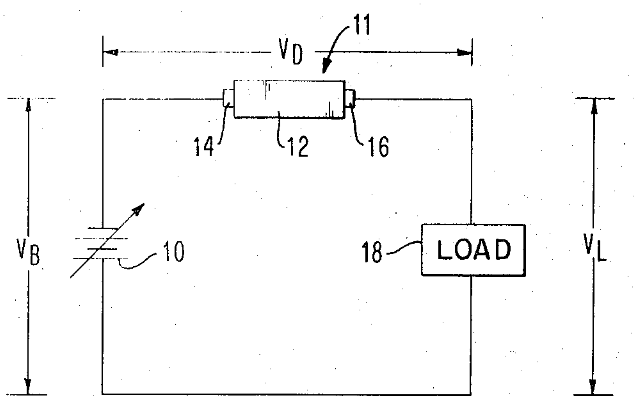
FIGS. 1, 1A and 1B are circuit diagrams of microwave oscillator circuits.

FIG. 1 is a circuit diagram of a microwave oscillator circuit which includes a variable voltage source 10, a semiconductor bulk effect device 11 formed of a body of semiconductor material 12 with two electrodes 14 and 16 on opposite surfaces of the body, and a load circuit represented by block 18. In the embodiments disclosed herein the semiconductor body 12 is formed of N type gallium arsenide which is prepared to exhibit a relatively high resistivity, for example, in the order of 1 to 10 ohm centimeters. The gallium arsenide body 12, when subjected to an appropriate electric field, produced, for example, by applying a voltage across electrodes 14 and 16, has nucleated therein domains of electric field concentration. These domains propagate from a point adjacent to the electrode 14, which is connected to the negative terminal of the power supply and is termed the cathode, across the body to the electrode 16 which is connected to the positive terminal of the power supply and is termed the anode.

Figure 1A:
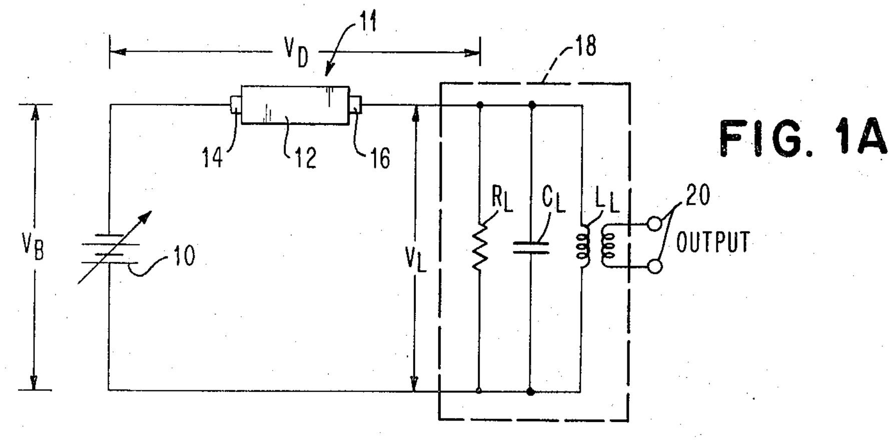
Figure 1B:
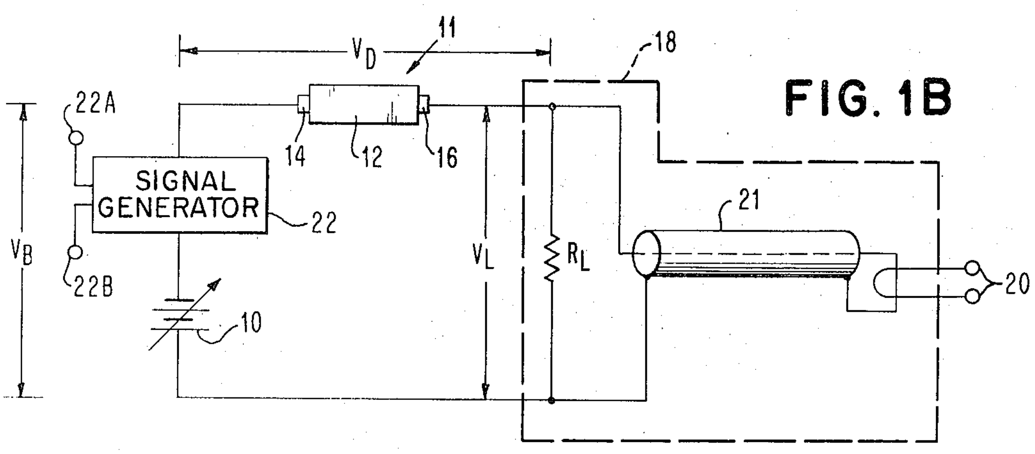

Since this invention relates primarily to particular modes of operating a microwave oscillator circuit wherein distinct advantages are realized by proper combinations of bulk effect devices with voltage sources and loads, the generalized circuit of FIG. 1 is descriptive of both prior art circuits and circuits of the type to which this application is directed. Thus this circuit is illustrated and described with reference to FIG. 2, which depicts the current-voltage characteristics of the bulk device 11 to describe first the conventional mode of operating this general type of circuit to produce a microwave output, and then the structure and modes of operation according to the principles of the present invention. The circuits of FIGS. 1A and 1B illustrate two different types of resonant load circuits which may be used. In the circuit of FIG. 1A the resonant circuit is formed of a capacitance $C_L$ and an inductance $L_L$ which are connected in parallel. A resistance $R_L$ represents both the resistive losses inherent in the resonant circuit and the effects of a load connected across output terminals 20. The circuit of FIG. 1B differs in that a coaxial line 21 is employed and further in the provision of a signal generator 22 the function of which is described in detail below.

Referring again to FIG. 1, three arrows in that figure designated $V_B$, $V_D$, and $V_L$ represent respectively the voltage supplied by battery 10, the voltage drop across the device 11 and the voltage drop across load 18. With the connections shown, the supply voltage $V_B$ is equal to the sum of the load voltage $V_L$ and the bulk device voltage $V_D$. It is this latter voltage that is plotted as the abscissa in FIG. 2, the ordinate representing the current $I_D$ which flows both through device 11 and the load 18. The load voltage $V_L$ increases when the device voltage $V_D$ decreases and vice versa, the sum of these voltages being always equal to the supply voltage $V_B$. For this reason the curve of FIG. 2 is also indicative of the changes in voltage and current across load 18.

Figure 2:
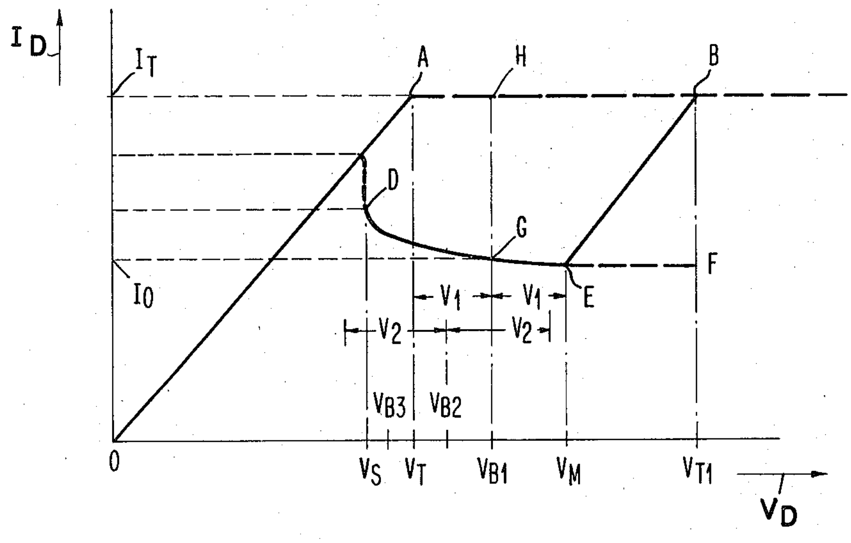
FIG. 2 is a plot illustrating the voltage current characteristics of the bulk effect device used in the circuits of FIGS. 1, 1A and 1B.

Referring now specifically to FIG. 2, it can be seen that as the voltage $V_D$ is increased from zero, the current $I_D$ increases with voltage as represented by the segment OA. It should be noted here that the voltage - current characteristics shown in FIG. 2 are somewhat idealized and that all transient conditions are not depicted. The plot is however accurate in representing those characteristics of the current voltage relationships necessary to understand the operation for the various oscillating modes described herein. When the voltage is increased from zero to the value $V_T$, the operating point is at A and a current $I_T$ flows in the device. The voltage $V_T$ is the threshold voltage and if the voltage $V_D$ across device 11 exceeds this value and the operating point is on the dashed segment AB, a domain is nucleated adjacent to electrode 14, and the current through the device decreases. It is for this reason that the segment AB of the curve of FIG. 2 is shown in dashed form to indicate that points along this segment are unstable. The actual conditions following the transition accompanying the nucleation of the domain are represented by the curved segment DE. Thus, if the voltage is increased to a value $V_{B1}$, the device assumes an operating condition at point G on curve DE, the higher current point H on curve AB being unstable.

It is in this region with a voltage $V_D$ across the device 11 in excess of the threshold voltage $V_T$ that oscillators of this type have been operated in the past. This type of oscillation may be understood by referring to FIG. 3 which is a plot of the variations in current $I_D$ in the circuit assuming that load 18 is purely resistive. The plot depicts the changes in current with time after the oscillating mode has been achieved, the initial time being a time $T_A$ when the current is momentarily at the higher value $I_T$ depicted in FIG. 1. The operating point is therefore at H in FIG. 2, which is unstable since with this voltage across device 11, a domain is nucleated in gallium arsenide adjacent the cathode terminal 14. The current in the device drops to the value $I_O$ and the operating point is at G in FIG. 2. This current drop from $I_T$ to $I_O$ is depicted in FIG. 2 to occur immediately after the time $T_A$. The reduction in the current causes a reduction in the voltage $V_L$ across the assumed purely resistive load and, since the voltage supplied by battery 10 is constant, this results in an increase in the voltage across device 11. Thus the operating point is moved to the right along the curve GE an amount which is determined by the value of the resistive load. Though it is this change across the load which is available as output microwave power, for the case under consideration it is assumed that the resistive load is small and only a slight change in voltage occurs. The effect of this voltage change on the curve of FIG. 2 is neglected for the present and the operating point is considered to remain at point G as the domain propagates across the body 12 of gallim arsenide from the cathode 14 to the anode 16. The current thus remains at the value $I_O$.

Figure 3:
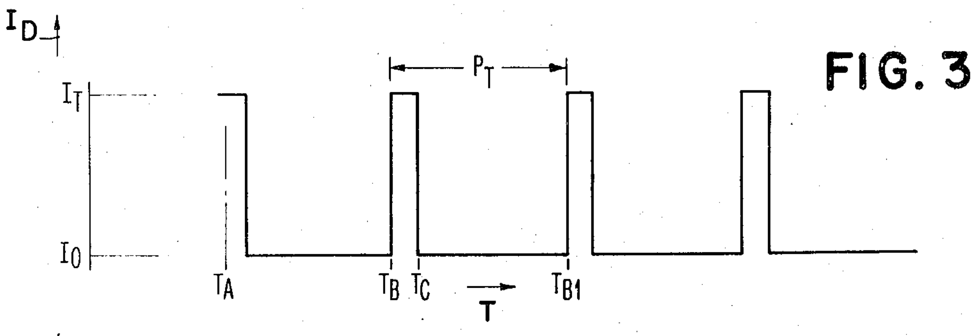
FIG. 3 is a plot illustrating the current waveform for the oscillator circuit of FIG. 1 when the load is essentially resistive.

When the domain reaches the anode, it is extinguished and the current rises to the value $I_T$. This occurs at a time $T_B$ in FIG. 3 and the transition is from the point G to H in FIG. 2. The point H is, as stated, unstable and a new domain is nucleated at the cathode causing the current to again drop to $I_O$ (point H in FIG. 2 and time $T_C$ in FIG. 3). The new domain nucleated at the cathode propagates to the anode, during which propagation, the current remains at the value $I_O$. At time $T_{B1}$ this domain is extinguished at the anode and the process of current rise, domain nucleation, and current drop is repeated. This process continues to produce an oscillating output as indicated in FIG. 3. The frequency of this oscillation is determined by the time it takes a domain to propagate from cathode to anode. This is termed the transit time mode. The period of this oscillation for this mode is shown in FIG. 3 to be $P_T$.

It should be noted at this point that since the curve DGE in FIG. 2, which represents the current voltage condition when a domain is propagating in the material, has a negative slope. When the voltage drops across the still assumed purely resistive load 18 causing an increase in the voltage across device 11 as a domain is nucleated, for example, at time $T_B$ in FIG. 2, the voltage across the device increases and the operating point moves in FIG. 2 from G toward E. Though, as has been assumed above, the voltage change is slight where the load resistance is small, it does affect the operation of the circuit and the magnitude of this effect is determined by the relationship between the value of the negative impedance of device 11 in this state and the characteristics of the load. It should be emphasized that this negative impedance is different than the negative impedance associated with the current voltage changes which occur when a domain is nucleated or extinguished and the operating point shifts suddenly between points H and G.

A second conventional mode of operation of bulk effect microwave oscillators is what may be termed a harmonic mode. In this mode the load represented at 18 in FIG. 1 is in the form of a resonant circuit whose resonant frequency is a multiple of the frequency of the device when operated in the transit time mode described above. The output taken across the load is then at the resonant frequency of the load circuit, energy being delivered to the load circuit to maintain the oscillations each time a domain is nucleated or extinguished.

Figure 4:
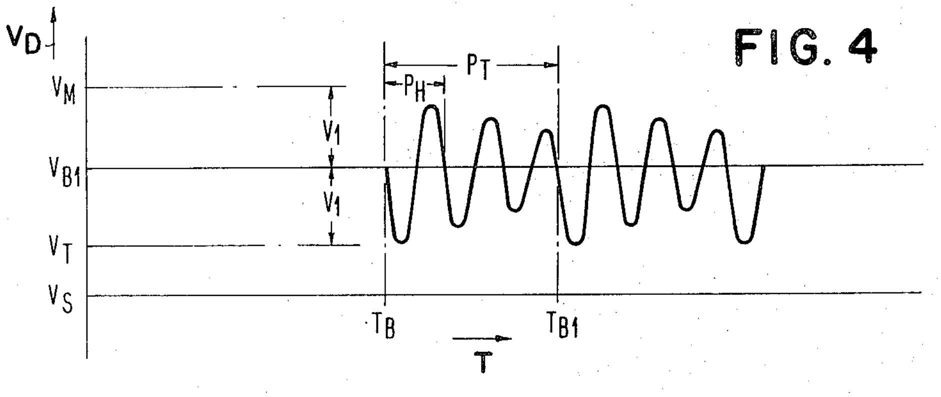
FIG. 4 is a plot depicting the voltage waveform across the bulk effect device in the microwave oscillator circuits of FIGS. 1, 1A and 1B when the load circuit is resonant at a harmonic of the transit time frequency of the bulk effect device.

FIG. 4 is a plot depicting the changes in voltage $V_D$ across the device 11 for operation in the harmonic mode when the load circuit 11 has a resonant frequency of three times the transit time frequency. The period of the output is represented at $P_H$ in FIG. 4 and the period $P_T$ for the fundamental transit time mode is shown for comparison. With this type of a load the DC average resistance of the load is essentially zero and thus the average or DC voltage across the element 11 is equal to this battery voltage. The voltage is equal to the value $V_{B1}$ and as shown in FIG. 4 the voltage $V_D$ across the element 11 oscillates around this value. A similar oscillation is produced across the load and is available as an output. The amplitude of the voltage swings in this oscillation determines the power output and for this reason a relatively large maximum voltage amplitude designated $V_1$ is shown. The amplitude of this voltage is determined by the AC impedance of the load circuit, the amplitude increasing as the impedance is increased. Though it might be thought that output power is also increased merely by increasing applied voltage, this is not the case since there are a number of parameters which govern the nucleation and propagation of domains in the gallium arsenide body. One of these which is the well known fact that though the voltage across the body, (more precisely the electric field)

must be above a threshold voltage $V_T$ in order to nucleate a domain, a somewhat lesser voltage is necessary to allow a domain once nucleated to propagate from cathode to anode. This voltage here termed the sustaining voltage is represented at $V_S$.

A third factor and one which has not been previously understood is that above a certain value of voltage a further instability is produced in the material. This voltage is represented at $V_M$ and as is indicated by the curve EB, if this voltage is exceeded even though a domain is propagating in the device, the current begins to increase with time. If the voltage is increased to a value of voltage $V_{T1}$, the operating point is at B with the current at $I_T$ in FIG. 2. It has been found that a second domain is then nucleated at the cathode even while the first domain is propagating in the material. When this domain is nucleated, the current again drops, but almost immediately one of the domains, usually the first one nucleated, is extinguished before reaching the anode. This phenomenon is repeated thereby producing oscillation in the circuit over and above those produced when only a single domain is propagated. Though this double domain phenomenon may be employed to advantage in what is termed an over voltage mode of operation, the entire region of operation above the voltage $V_M$ is somewhat unstable and is preferably avoided during transit time mode operation.

It is for these reasons that the limits of pure transit time mode operation is in the region bounded by the voltage values $V_M$ and $V_T$ and the applied voltage $V_{B1}$ for this mode of operation is centered between these values to allow for the largest amplitude voltage swings and therefore the largest power output. The same is true for harmonic mode operations of the type depicted in FIG. 4. However it should be noted in this figure that the amplitude of the oscillation in the resonant circuit diminishes during the time between the application of energy when domains are extinguished and nucleated. Thus for the harmonic mode of FIG. 4 it is possible to allow the maximum voltage swing to carry the voltage $V_D$ below $V_T$, however the amplitude of the oscillation must be diminished so that the voltage $V_D$ is again above the threshold value $V_T$ at time $T_{B1}$ to allow a new domain to be nucleated. The amount by which the oscillating harmonic wave of FIG. 4 diminishes with time is dependent upon the relationship between the impedance characteristics of the load and the negative impedance of the gallium arsenide when a domain is propagating (segment DGE in FIG. 2). By proper design the wave can be made to remain constant or even grow in the time between domain nucleations.

Figure 5A:
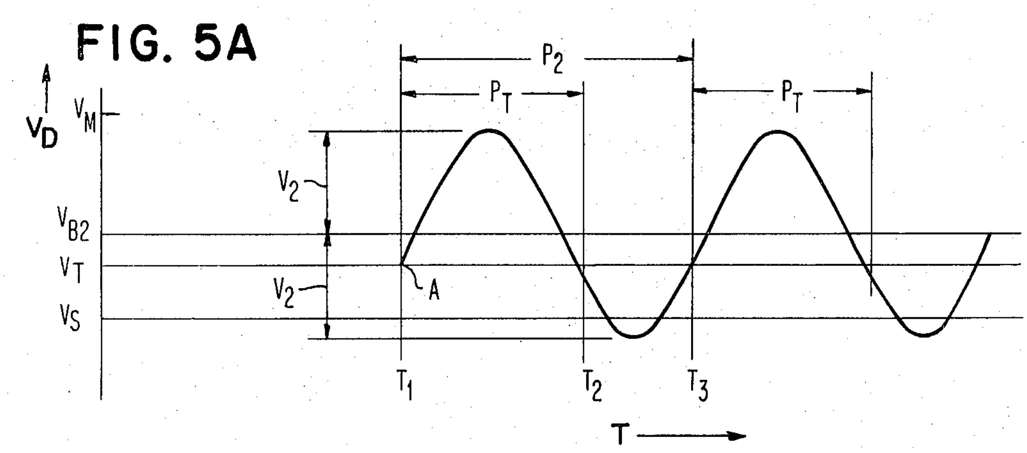
FIGS. 5A, 5B, 5C and 5D are plots depicting the voltage waveforms across the bulk effect device when operated in accordance with the principles of the present invention in an under voltage mode at different frequencies determined by the resonant frequency characteristics of the load circuit.

Another mode of operation which is believed to allow the more complete realization of the potentialities of the oscillator circuit is illustrated by the curves of FIGS. 5A, 5B, 5C, 5D. This mode of operation is termed an under voltage mode in that during the oscillation the voltage across the element 11 is decreased not only below the threshold voltage $V_T$ but also below the sustaining voltage $V_S$. FIG. 5A depicts the voltage $V_D$ across element 11 when the load 18 circuit is designed to have a frequency which is slightly greater than half the transit time frequency. The period for this frequency is represented at $P_2$ and is about 1.6 times the period $P_T$ for the transit time frequency which is shown for comparison purposes. The voltage supplied by source 10 of FIG. 1 is at a value $V_{B2}$ which, as shown in FIGS. 2 and 5A is only slightly above the threshold voltage $V_T$. The impedance of the load is relatively high so that a large voltage oscillation $V_2$ is realized. The wave of FIG. 5A is shown to begin at a time $T_1$ when the oscillating wave has been established and the voltage $V_D$ is equal to threshold voltage $V_T$ (point A in FIG. 2) to cause a domain to be nucleated in the device 11 of FIG. 1. The voltage continues to rise due to the energy stored in the resonant circuit and at the same time a current drop is produced due to the domain nucleation in the device 11 (transition in FIG. 2 from segment AHB to segment DGE). This drop in current as explained above produced a voltage drop across the load 18 and a voltage increase across the device 11. Since the oscillation voltage across device 11 is increasing at this time and the voltage across the load is therefore increasing, the nucleation of the domain sustains the oscillation in the circuit.

The domain once nucleated propagates from the cathode 14 (FIG. 1) to anode 16 and is then extinguished at time $T_2$ to again provide a voltage change which is in phase with the oscillation. Though a new domain would then be ordinarily nucleated at a time $T_2$, the voltage $V_D$ across the bulk effect device is now below the threshold voltage $V_T$. Thus no new domain is nucleated until a time $T_3$ when voltage has swung back up to the threshold voltage and the nucleation and propagation is repeated.

From an examination of FIG. 5A it can be seen that the current through the device is at a relatively low value (along segment DGE in FIG. 2) for a portion of each cycle (time $T_1$ to time $T_2$) when a domain is present in the body and at a higher current value for a significant portion of each cycle (time $T_2$ to time $T_3$) when no domain is present. The current remains at this higher value with no domain present for this time since the voltage across the device is below $V_T$ when the initial domain is extinguished. As a result the current waveform approaches that of a square wave and a large power output is available across the load. This type of current wave is not available in the transit time modes, whether fundamental or harmonic, since in these modes a new domain is immediately nucleated when a previous domain is extinguished. The current is therefore at the higher value only during the short time required for the extinction renucleation process, for example, the time from $T_B$ to $T_C$ in FIG. 3.

From the above it can be seen that the output oscillation is produced at a frequency appreciable lower than the frequency of the transit time mode, the output is a high power output, and at the same time only a relatively low supply voltage $V_B$ is required therefore minimizing power loss in the gallium arsenide body and increasing the output efficiency.

Figure 5B:
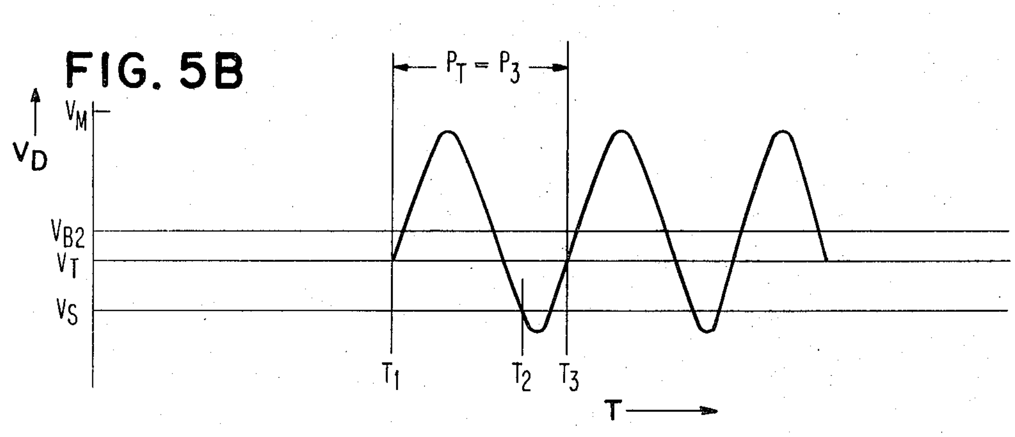

The same principles can be applied to provide outputs at high frequencies. FIG. 5B illustrates the voltage waveform across the device 11 in the circuit of FIG. 1 when the load circuit 18 has a resonant frequency equal to the transit time mode frequency. This is indicated by the illustrated equality between the period $P_T$ for transit mode operation and the period $P_3$ for this resonant circuit. A fundamental difference in the internal operation of the device is produced in the mode of operation shown in FIG. 5B. The domain is nucleated as before when the voltage reaches the threshold voltage $V_T$ at time $T_1$ and begins to propagate through the gallium arsenide body. However before the domain can propagate across the body to the anode 16 (FIG. 1) and thereby be extinguished, the voltage $V_D$ at time $T_2$ in FIG. 5B drops below the sustaining voltage $V_S$. This causes the domain to be extinguished independently of its position at time $T_2$. No new domain is nucleated until time $T_3$ when the threshold voltage $V_T$ is again exceeded and the process repeats itself. As in the embodiment of FIG. 5A, the domain is nucleated at a time when the oscillating voltage across device 11 is increasing and the domain is extinguished at a time when the oscillating voltage across the device is decreasing.

Figure 5C:
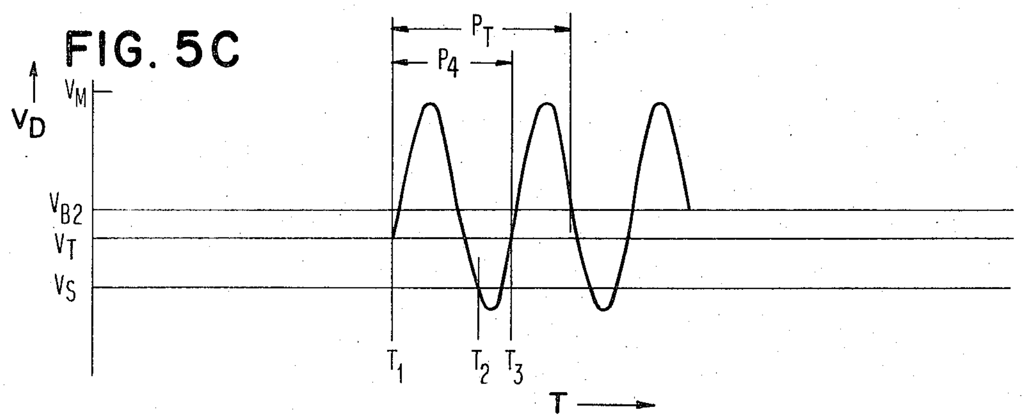

The waveform of FIG. 5C depicts the operation when the load circuit 18 is designed to have a resonant frequency higher than that of the transit time mode. The period for this mode is designated $P_4$ and is less than the period $P_T$ for the transit time mode. The domain is nucleated as above at time $T_1$, when the voltage $V_T$ is reached, and extinguished at time $T_2$ when the voltage across the device 11 falls below the sustaining voltage $V_S$. A new domain is nucleated at time $T_3$ when the voltage is again raised above threshold and the process is repeated to sustain the microwave oscillations.

Figure 5D:
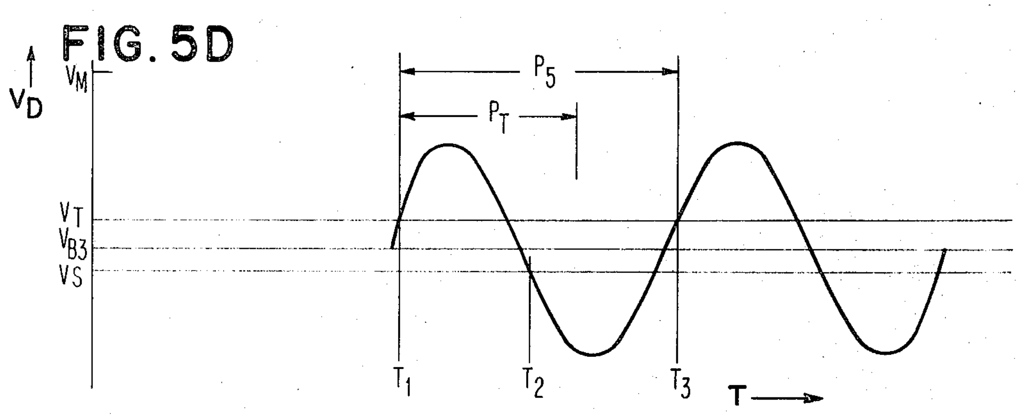

The waveform of FIG. 5D illustrates the operation of the device when the load circuit 18 is resonant at a frequency less than the transit time frequency, as is the case in FIG. 5A, but differs from the previous embodiments in that the supply voltage designated $V_{B3}$ is below the threshold voltage $V_T$. If the supply voltage is maintained at this level, no domain is nucleated and no oscillations are produced. The circuit may however be triggered by energizing the signal generator 22 of FIG. 1B to cause this generator to momentarily apply a signal which raises the voltage above the threshold voltage $V_T$ and initiates domain nucleation and oscillations in the circuit. Once the oscillations are initiated, the signal applied by signal generator 22 may be terminated and the oscillations will continue as described above. A domain is nucleated at time $T_1$ as the threshold voltage $V_T$ is reached and is extinguished at time $T_2$ since the voltage $V_D$ across the element 11 drops below the sustaining voltage $V_S$ before the domain reaches the anode 16 of the device. The operation continues with a new domain being nucleated at time $T_3$, the period of the oscillations being indicated at $P_5$.

The oscillating condition of the circuit under the conditions of FIG. 5D may be interrupted by energizing the signal generator 22 to apply a signal of opposite polarity to reduce the voltage $V_D$ across the device. Thus the control signals to start oscillations are applied at a terminal 22A of generator 22 and the terminating control signals are applied at a terminal 22B. The mode of operation depicted in FIG. 5D is advantageous in that the continuous DC voltage which is applied is lower, and the circuit is bistable. The voltage may be decreased even further, even to or below the sustaining voltage $V_S$ in which case larger triggering signals are required.

In the circuits discussed above with reference to FIGS. 5A, 5B, 5C, and 5D, the frequency of the microwave oscillation is controlled by the resonant frequency of the load circuit. It should be understood however that since the oscillations occur both across the load circuit 18 and the device 11, the impedance of the device 11 including the reactance and the negative resistance characteristic of a propagating domain affect the actual operating frequency. The upper frequency limit is determined only by the circuit and not by the transit time of domains in the device. The lower frequency limit for the preferred mode of operation is around one half the transit time frequency, the limiting condition being that the voltage across the device should be below the threshold voltage when the nucleated domain reaches the anode. Each of these modes of operation differs from the harmonic mode of FIG. 4 in that a domain is nucleated and extinguished during each cycle and energy is therefor delivered to sustain the oscillation and produce output power at the desired microwave frequency.

The same general principles may be applied to achieve operation in the over voltage mode, that is in the higher voltage region above $V_M$ wherein the double domain instability effects occur. In operating in this mode the supply voltage is maintained at a high value. The load circuit is designed to provide oscillations of sufficient amplitude so that the upper threshold voltage $V_{T1}$ is exceeded once each cycle, to provide the domain extinction and nucleation under control of the oscillating voltage necessary to maintain oscillations at a frequency determined by the resonance of the circuit.

It should be of course realized that the practice of the invention is not limited to the details of the particular embodiments disclosed herein. Thus, through N type gallium arsenide is disclosed as a preferred material for use in the bulk effect device, the Gunn Effect phenomenon has also been observed in other semiconductor materials such a indium phosphide and cadmium telluride. In bulk effect devices of this type, regardless of the material used, it should also be emphasized that it is not necessary that the electrodes be placed on opposite faces of the semiconductor wafer nor is it necessary that the domains be nucleated and extinguished in a portion of the material adjacent to the cathode and anode electrodes. Since it is the electric field gradient in the material which is critical to both the nucleation and extinction of domains, the points at which the domains are nucleated and extinguished can be controlled by the geometry of the semiconductor body or by the resistivity characteristics of a portion of the body. Thus, for example, nucleation may be produced of either double or single domains in a portion of the body away from the negative electrode where, because of either geometry or resistivity characteristics a region of high electric field is produced and domains may be extinguished in a portion of the body away from the positive electrode where because of either geometry or resistive characteristics a region of low electric field is produced.

While the invention has been particularly shown and described with reference to preferred embodiments thereof, it will be understood by those skilled in the art that various changes in form and details may be made therein without departing from the spirit and scope of the invention.

What is claimed is:

1. A microwave oscillator circuit comprising:

a. a bulk effect device including a body of semiconductor material capable of having nucleated therein domains of electric field concentration which propagate in said body;

b. said body being capable of having domains nucleated therein when the voltage across said device exceeds a first threshold voltage $V_T$ at a time when no domain is propagating in the body and when the voltage across the device exceeds a second higher threshold voltage $V_{T1}$ even when a domain is propagating in the body;

c. means including a voltage source and a load circuit connected to said device for causing domains to be nucleated, propagated and extinguished in said body and produce voltage oscillations across said device;

d. said oscillations causing the voltage across said device to oscillate above and below one of said threshold voltages.

2. The microwave oscillator of claim 1 wherein the voltage across said device oscillates above said one threshold voltage once each cycle of oscillation to nucleate a new domain in said body and oscillates below said one threshold voltage before the nucleated domain is extinguished.

3. The microwave oscillator of claim 1 wherein said oscillations cause said voltage across said device to oscillate above and below said first threshold voltage $V_T$ and the maximum voltage across said device during said oscillation is less than said second threshold voltage $V_{T1}$.

4. The microwave oscillator of claim 1 wherein said oscillations cause said voltage across said device to oscillate above and below said second threshold voltage $V_{T1}$ and the minimum voltage across said device during said oscillations is greater than a sustaining voltage $V_S$ necessary to maintain a nucleated domain propagating in said body.

5. In a high frequency oscillator circuit including a bulk effect device which includes a body of single conductivity semiconductor material which is responsive to a voltage above a threshold voltage for the body to exhibit a negative conductivity characteristic and change from a state in which it exhibits a high conductivity to a state in which it exhibits a low conductivity, and which remains in said low conductivity state for a time T dependent upon the length of the body in which the low conductivity state is produced, as long as the voltage is maintained at an amplitude sufficient to sustain said low conductivity state for said time T; the improvement comprising;

a. means for applying to said semiconductor body a voltage above the threshold voltage;

b. a load connected to said semiconductor body forming a resonant circuit having a frequency whose period is less than T and having an impedance sufficiently high that when the threshold voltage for the semiconductor body is exceeded by said applied voltage, large amplitude oscillations are produced which cause the voltage across the semiconductor body to oscillate above and below said threshold voltage;

c. said body undergoing a change from the high conductivity to the low conductivity state once each cycle of oscillation as the voltage across the device oscillates above the threshold voltage and undergoing a change back to the high conductivity state one each cycle of oscillation as the voltage across the device oscillates below the amplitude necessary to sustain the low conductivity state.

6. The high frequency oscillator circuit of claim 5 wherein said bulk effect device includes a cathode electrode and an anode electrode connected to opposite ends of said body and said time T is dependent upon the length of said body between said cathode and anode electrodes.

7. A bulk effect semiconductor oscillator circuit including;

a. a body of semiconductor material which in response to a voltage above a threshold voltage exhibits a negative conductivity characteristic and a change from a high conductivity state to a low conductivity state in which it remains for a time T dependent upon the length of the body in which the change is produced as long as the voltage across the body is maintained above a minimum voltage necessary to sustain the body in said low conductivity state for said time T;

b. means connected to said body for applying a voltage above said threshold voltage to said device;

c. and load means connected to said device having a sufficiently high impedance that large scale oscillations are produced when said voltage is applied which oscillations raise the voltage across said body above said threshold voltage at a time $T_1$ in each cycle of oscillation and lowers the voltage across said body below said threshold at a time $T_2$ in each cycle of oscillation;

d. the time between time $T_1$ and time $T_2$ being less than the time T.

8. The oscillator circuit of claim 7 wherein said load is a circuit which is resonant at a frequency having a period less than T.

9. The oscillator circuit of claim 7 wherein said voltage is lowered below said minimum sustaining voltage at said time $T_2$ in each cycle of operation.

10. In high frequency oscillator circuit including a bulk effect device which includes a body of single conductivity semiconductor material of the type which responds to a voltage above a threshold voltage to exhibit a negative conductivity characteristic accompanied by a high field domain nucleation and propagation process which, once initiated, normally continues as long as the voltage across the semiconductor body is maintained above a sustaining voltage for the process for a time T determined by the length of the semiconductor body; the improvement comprising;

a. means for applying a voltage in excess of said threshold voltage to said semiconductor body to produce high frequency oscillations in said circuit;

b. a load coupled to said body which is resonant at a high frequency and has a sufficiently high impedance that when the threshold voltage across the semiconductor body is exceeded by said applied voltage to produce oscillations, said negative conductivity and accompanying domain nucleation and propagation process is initiated once each cycle of oscillation at a time $T_1$ as the voltage across the body is increased above the threshold voltage and is interrupted once each cycle of oscillation at a time $T_2$ as the voltage across the body is decreased by the oscillation below the sustaining voltage for the body;

c. and the time between time $T_1$ and time $T_2$ being less than the time T.

11. In a high frequency oscillator circuit of the type including a voltage source, and a load coupled to a body of single conductivity type semiconductor material which can respond to a voltage above a threshold voltage applied by said voltage source to produce high frequency oscillations as a result of a bulk negative conductivity characteristic of the body, which allows the body to be changed between high and low conductivity states, which is exhibited when a threshold voltage for the body is exceeded, and which is accompanied by a domain nucleation and propagation process that normally causes said high frequency oscillations to be produced at a transit time frequency determined by the time required for the domain to nucleate and propagate from a cathode to an anode on the body; the improvement comprising;

a. said load coupled to said body forming a circuit which is resonant at a frequency that is higher than said transit time frequency;
b. and said load having a sufficiently high impedance that large scale oscillations at said resonant frequency are produced across said load and said body when said threshold voltage is exceeded, and these oscillations across the body raise the voltage across the body above the threshold voltage once each cycle of oscillation to cause the body to assume a low conductivity state and lower the voltage across the body sufficiently below the threshold voltage once each cycle of oscillation to change said body from said low conductivity state to said high conductivity state.

12. In a high frequency oscillator circuit including a bulk effect device which includes: a body of single conductivity semiconductor material of the type which responds to a voltage above a threshold voltage to exhibit a negative conductivity characteristic accompanied by a high field domain nucleation and a propagation process which, one initiated, normally continues as long as the voltage across the semiconductor body is maintained above a sustaining voltage and propagates for a time T determined by the length of the semiconductor body; and means for applying a voltage across said body in excess of said threshold voltage; the improvement comprising:

means connected to said body for applying a control voltage across the semiconductor body within the time T to inhibit propagation and extinguish said domain.

13. The oscillator of claim 12, wherein said means for applying said control voltage is a resonant load circuit.

* * * * *